(12) United States Patent
Sakotsubo

(10) Patent No.: US 9,437,658 B2
(45) Date of Patent: Sep. 6, 2016

(54) FULLY ISOLATED SELECTOR FOR MEMORY DEVICE

(71) Applicant: SanDisk 3D LLC, Milpitas, CA (US)

(72) Inventor: Yukihiro Sakotsubo, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 49 days.

(21) Appl. No.: 14/451,664

(22) Filed: Aug. 5, 2014

(65) Prior Publication Data

US 2016/0043143 A1    Feb. 11, 2016

(51) Int. Cl.
*H01L 27/24* (2006.01)
*H01L 45/00* (2006.01)

(52) U.S. Cl.
CPC ......... *H01L 27/2481* (2013.01); *H01L 27/249* (2013.01); *H01L 27/2409* (2013.01); *H01L 27/2418* (2013.01); *H01L 27/2472* (2013.01); *H01L 45/1253* (2013.01); *H01L 45/08* (2013.01); *H01L 45/085* (2013.01); *H01L 45/1226* (2013.01); *H01L 45/146* (2013.01)

(58) Field of Classification Search
CPC ....................... H01L 27/2481; H01L 45/1253
See application file for complete search history.

(56) References Cited

U.S. PATENT DOCUMENTS

| 5,172,338 | A | 12/1992 | Mehrotra et al. | |
|---|---|---|---|---|
| 5,915,167 | A | 6/1999 | Leedy | |
| 7,919,806 | B2 * | 4/2011 | Fujiwara | B82Y 10/00 257/310 |
| 8,283,228 | B2 | 10/2012 | Alsmeier | |
| 8,410,540 | B2 * | 4/2013 | Araki | B82Y 10/00 257/324 |
| 8,587,989 | B2 * | 11/2013 | Manning | B82Y 10/00 365/148 |
| 9,227,456 | B2 * | 1/2016 | Chien | B24D 15/02 |
| 9,245,629 | B2 * | 1/2016 | Samachisa | G11C 13/003 |
| 2003/0185048 | A1 | 10/2003 | Fricke et al. | |
| 2009/0001344 | A1 | 1/2009 | Schricker et al. | |
| 2012/0112156 | A1 * | 5/2012 | Park | H01L 27/101 257/5 |
| 2012/0147648 | A1 * | 6/2012 | Scheuerlein | G11C 13/0002 365/51 |
| 2012/0211722 | A1 * | 8/2012 | Kellam | G11C 5/02 257/4 |
| 2013/0292633 | A1 * | 11/2013 | Pellizzer | H01L 45/06 257/5 |
| 2014/0134794 | A1 * | 5/2014 | Wang | H01L 45/065 438/104 |
| 2014/0248763 | A1 * | 9/2014 | Konevecki | H01L 21/28008 438/591 |
| 2014/0252454 | A1 * | 9/2014 | Rabkin | H01L 27/249 257/329 |
| 2015/0249112 | A1 * | 9/2015 | Takeguchi | H01L 27/2454 257/314 |

(Continued)

OTHER PUBLICATIONS

Kozicki, M. N. et al., "Multi-bit Memory Using Programmable Metallization Cell Technology," Proceedings of the International Conference on Electronic Devices and Memory, Grenoble, France, pp. 48-53, (Jun. 12-17, 2005).

(Continued)

*Primary Examiner* — Ida M Soward
(74) *Attorney, Agent, or Firm* — The Marbury Law Group PLLC

(57) ABSTRACT

A monolithic, three-dimensional memory device includes a substrate and a plurality of electrically conductive word lines over a major surface of the substrate. An electrically conductive bit line extends in a direction substantially perpendicular to the major surface of the substrate and adjacent to each of the plurality of word lines, and a non-volatile memory element material is located between the bit line and each of the plurality of word lines. A plurality of middle electrodes comprising an electrically conductive material are located between the bit line and each of the plurality of word lines, wherein the plurality of middle electrodes are discrete electrodes which are isolated from one another in at least the second direction.

15 Claims, 10 Drawing Sheets

(56) References Cited

U.S. PATENT DOCUMENTS

2015/0255619 A1* 9/2015 Shimabukuro ... H01L 29/78642
257/314

OTHER PUBLICATIONS

Takaki, S., "Transistor Device and Method of Making Thereof," U.S. Appl. No. 14/206,196, filed Mar. 12, 2014.

International Search Report and Written Opinion of the International Search Authority for PCT/US2015/041947, tiled Jul. 24, 2015, dated Dec. 1, 2015, 12 pages.

Schrogmeier, P. et al., "Time Discrete Voltage Sensing and Iterative Programming Control for a 4F2 Multilevel Cbram," 2007 Symposium on VLSI Circuits Digest of Technical Papers, pp. 186-187, (2007).

* cited by examiner

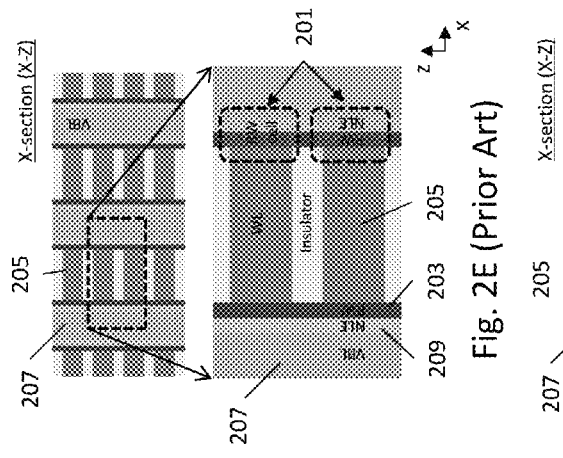
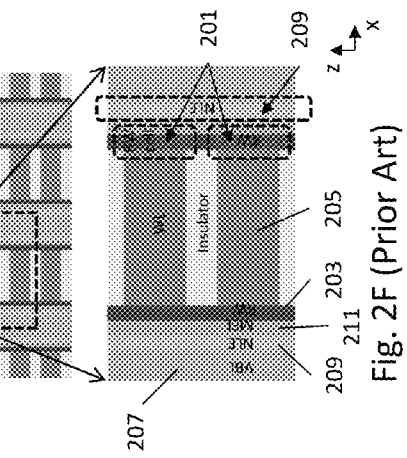
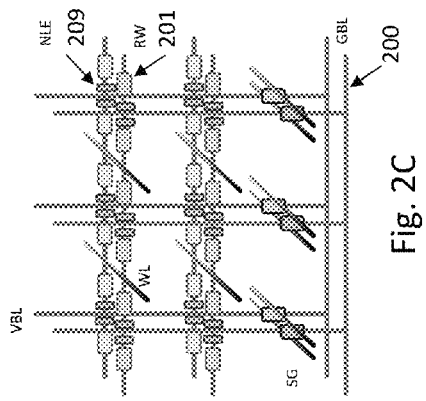
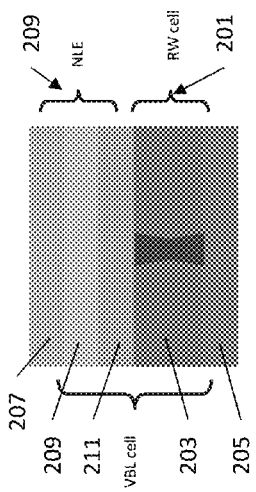
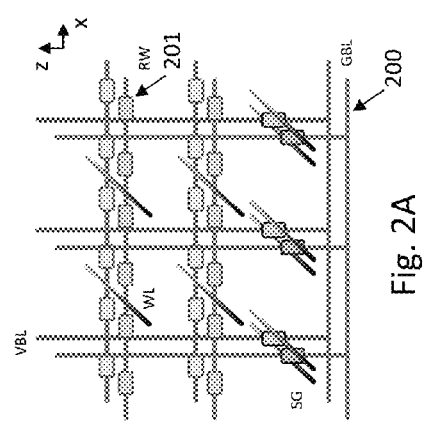
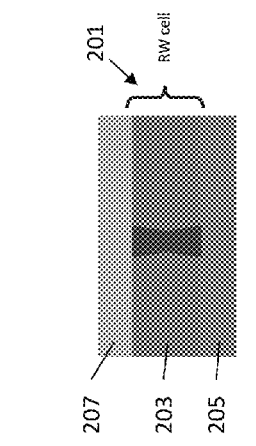
Fig. 2A
Fig. 2B
Fig. 2C
Fig. 2D
Fig. 2E (Prior Art)
Fig. 2F (Prior Art)

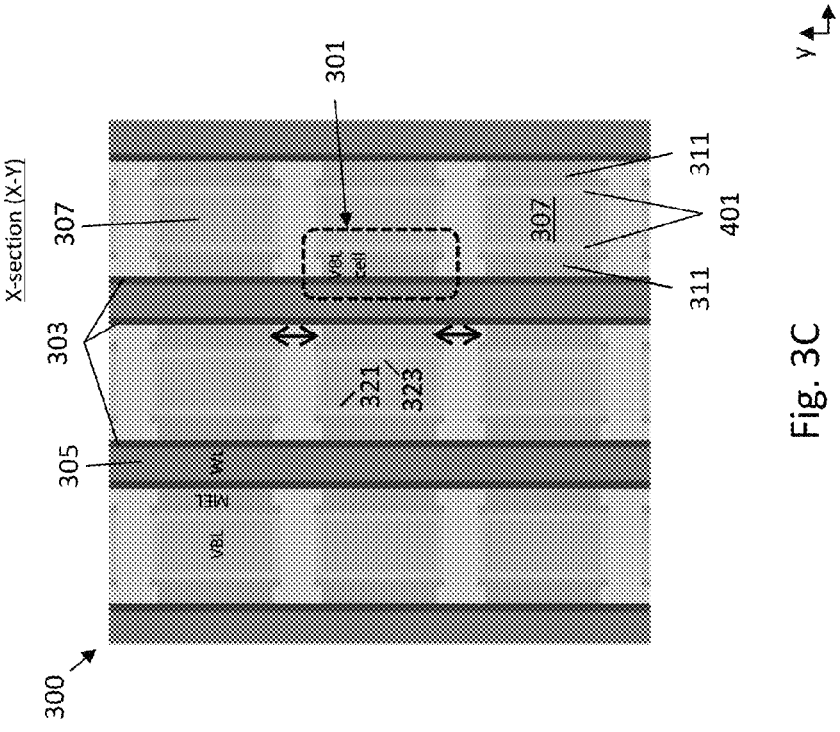
Fig. 3C
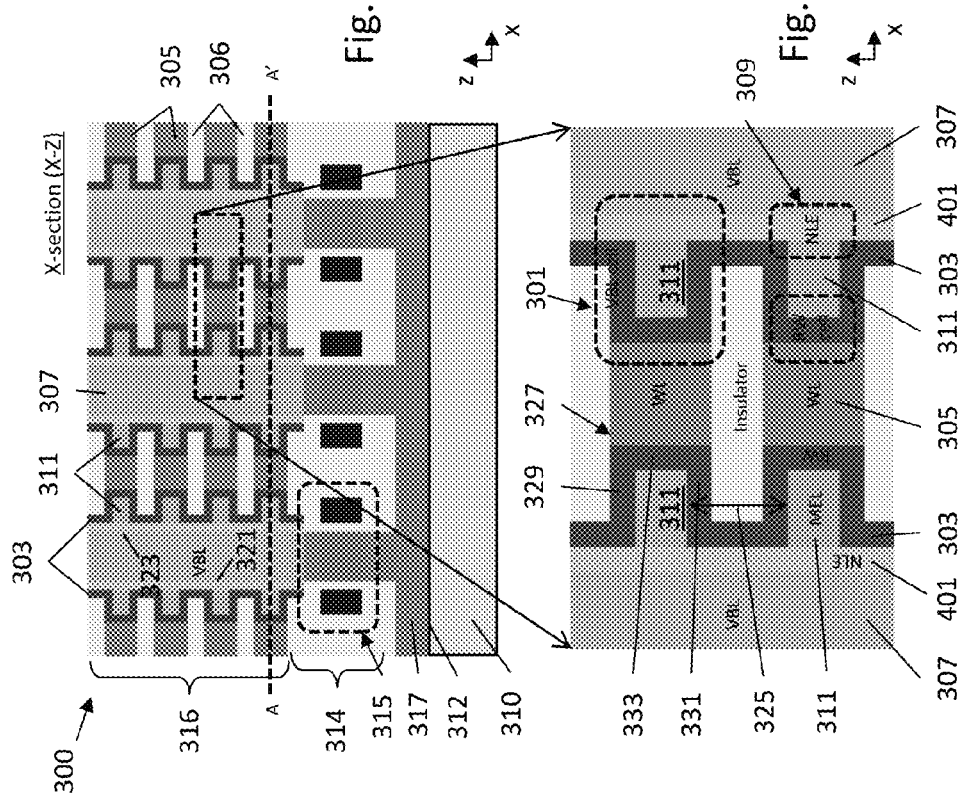
Fig. 3A
Fig. 3B

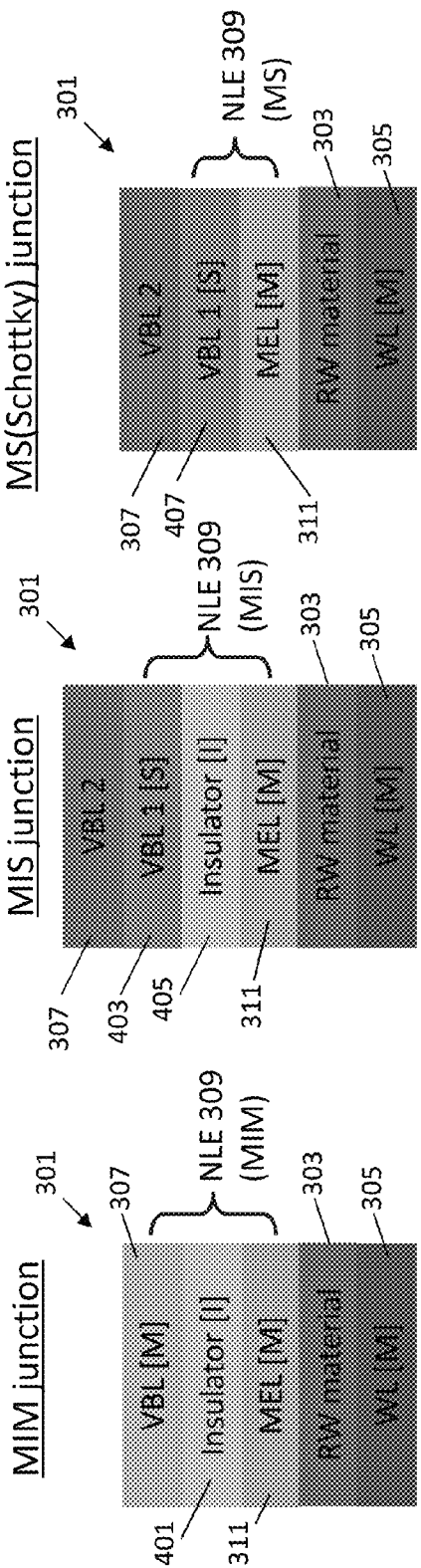
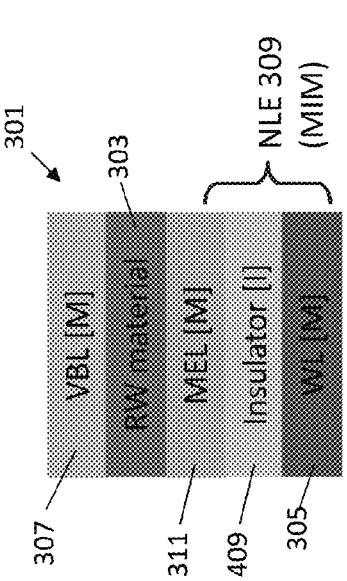

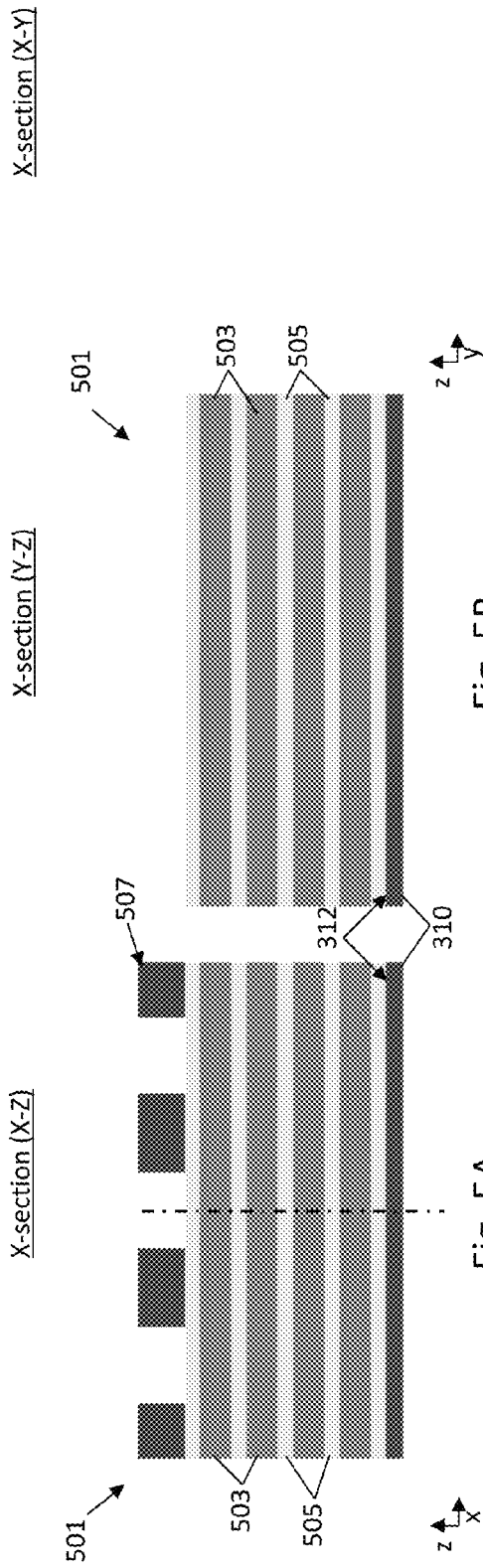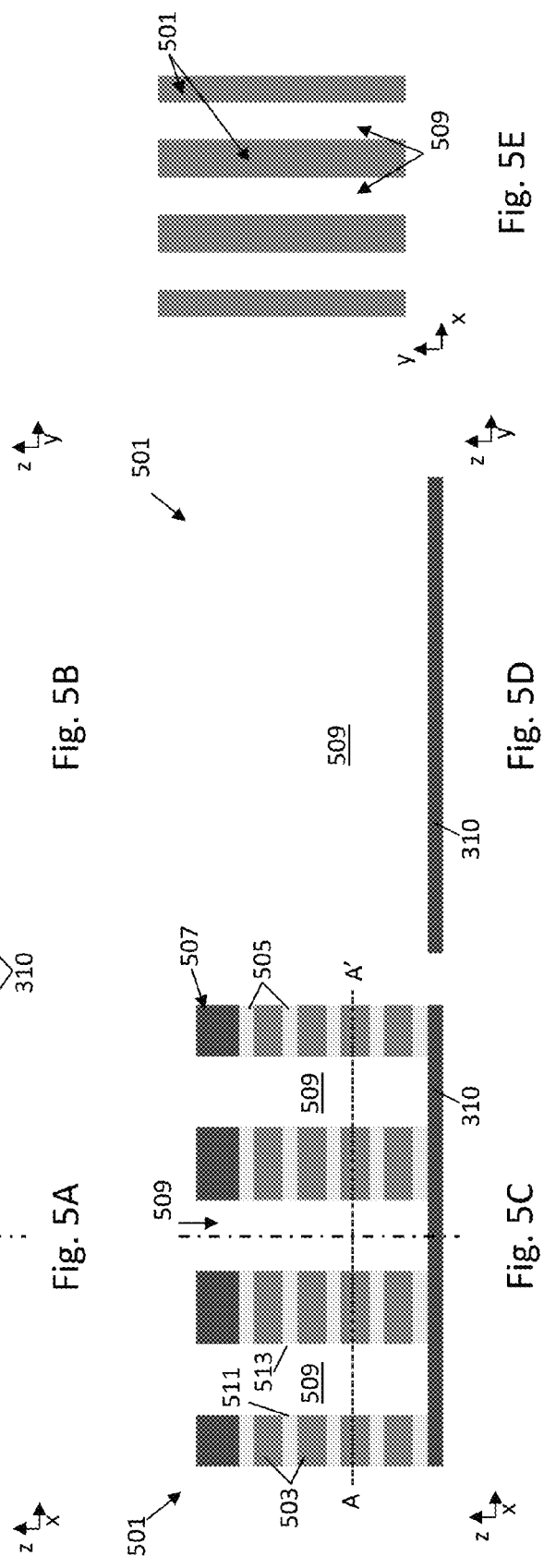

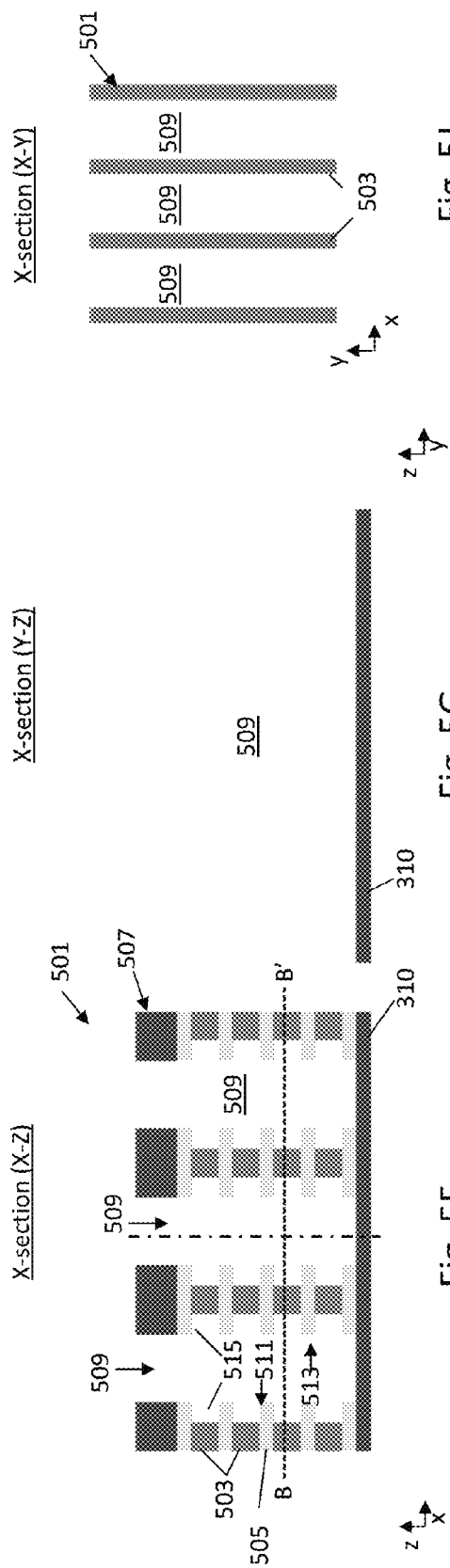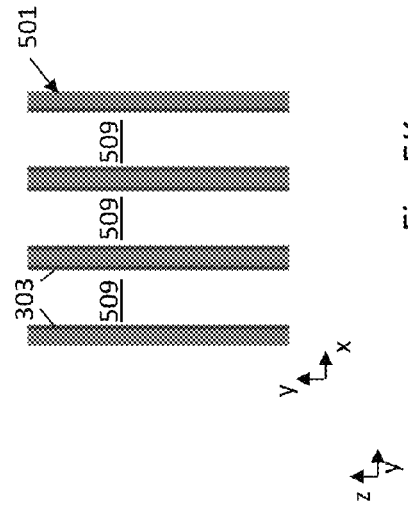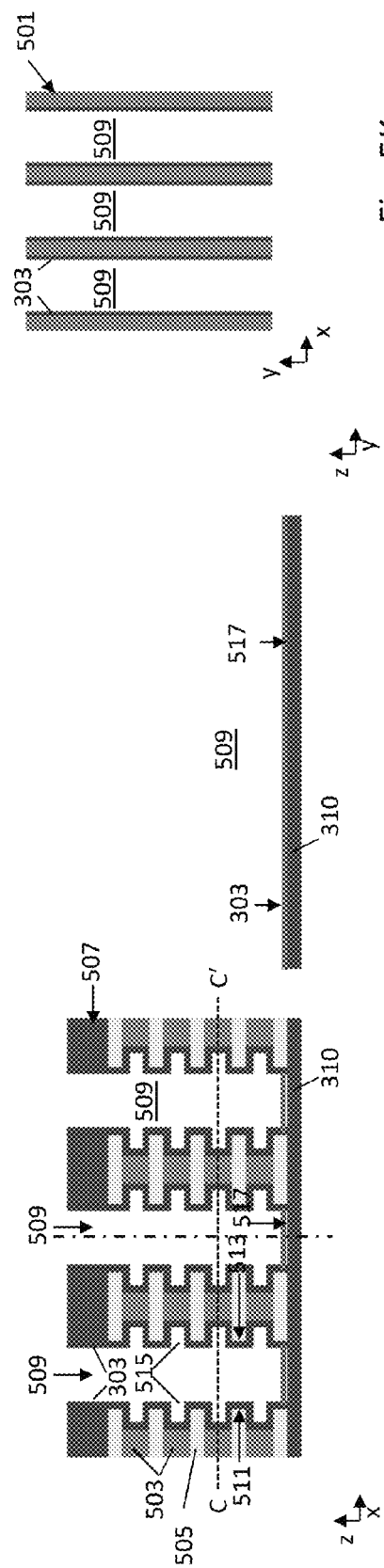

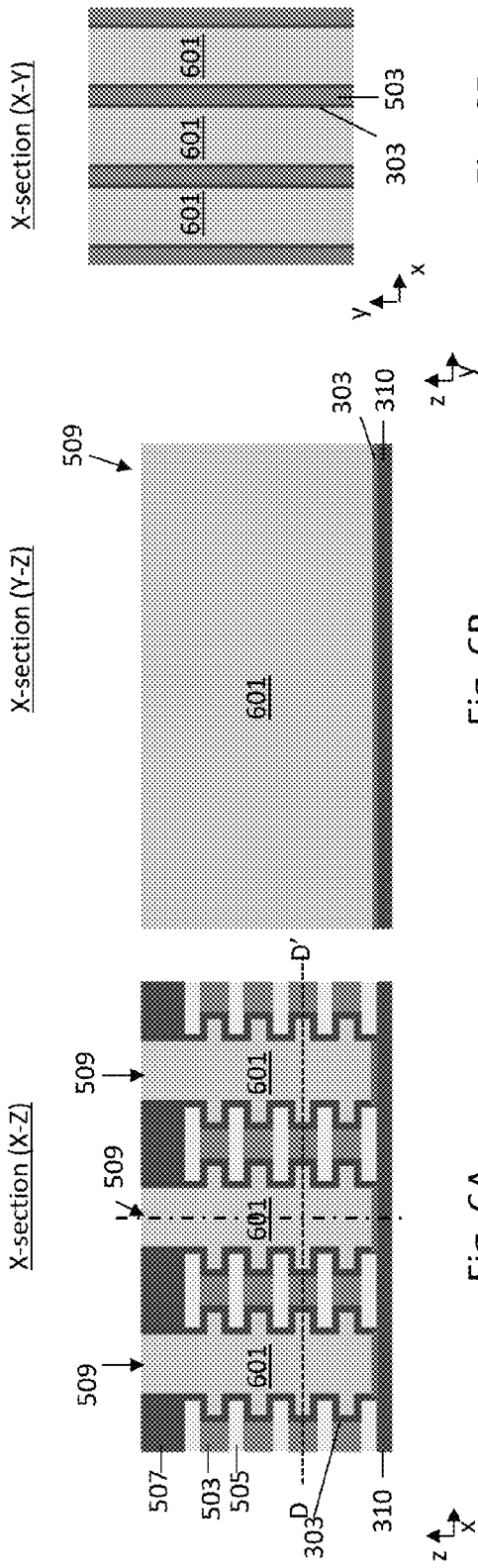

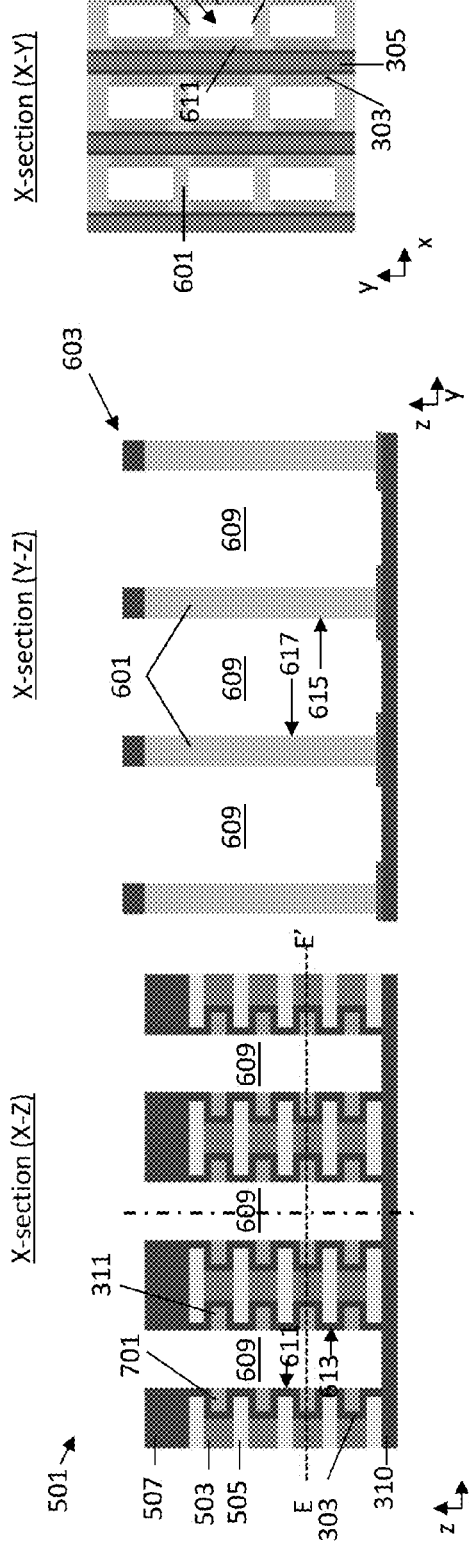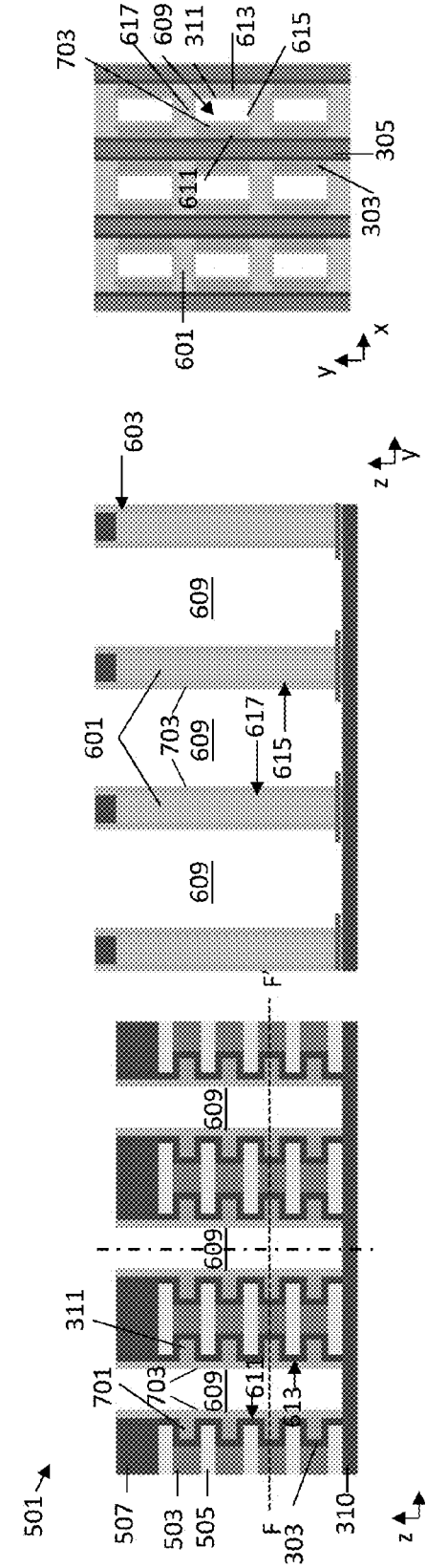

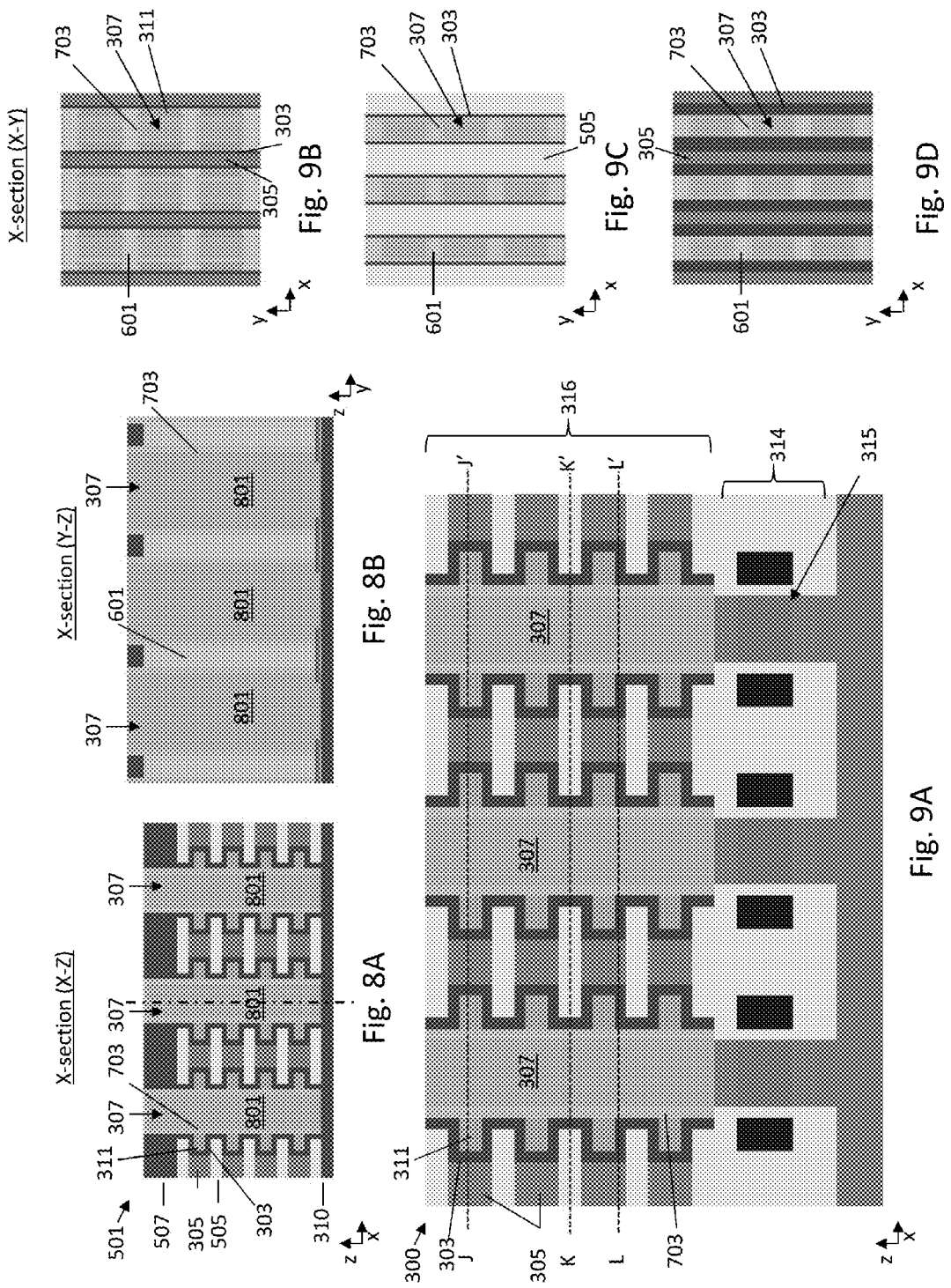

FULLY ISOLATED SELECTOR FOR MEMORY DEVICE

FIELD

The present invention relates generally to the field of semiconductor devices and specifically to vertical restive random access memory (ReRAM) devices and other three dimensional devices and methods of making thereof.

BACKGROUND

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. An example of an array of variable resistive elements and associated diodes is given in U.S. Patent Application Publication No. US 2009/0001344.

SUMMARY

One embodiment relates to a monolithic, three-dimensional memory device including a substrate having a major surface and a plurality of electrically conductive word lines over the major surface of the substrate, wherein each word line is elongated in a first direction that is substantially parallel to the major surface of the substrate and the plurality of word lines are spaced apart from one another in a second direction that is substantially perpendicular to the major surface of the substrate, and an electrically insulating material is located between each of the spaced apart word lines. An electrically conductive bit line extends in a direction substantially perpendicular to the major surface of the substrate and adjacent to each of the plurality of word lines, and a non-volatile memory element material is located between the bit line and each of the plurality of word lines. A plurality of middle electrodes comprising an electrically conductive material are located between the bit line and each of the plurality of word lines, wherein the plurality of middle electrodes are discrete electrodes which are isolated from one another in at least the second direction.

Another embodiment includes a method of fabricating a memory device that includes providing a stack of alternating layers of a first material and a second material different than the first material over a major surface of a substrate, the first material comprising an electrically conductive word line material and the second material comprising an electrically insulating material, etching the stack through a mask to form at least one opening having a sidewall defined by the alternating layers of the first material and the second material, selectively removing the first material relative to the second material through the opening to provide a plurality of recessed portions along the sidewall of the opening, forming a non-volatile memory element material over the sidewall of the opening and within the recessed portions, forming an electrically conductive electrode material over the non-volatile memory element material and filling the recessed portions along the sidewall of the opening, removing a portion of the electrically conductive electrode material from the opening to provide a plurality of isolated electrodes within the recessed portions, and forming an electrically conductive bit line material within the opening.

Another embodiment includes a method of fabricating a memory device that includes providing a stack of alternating layers of a first material and a second material different than the first material over a major surface of a substrate, the first material comprising an electrically conductive word line material and the second material comprising an electrically insulating material, etching the stack through a mask to form at least one opening having a sidewall defined by the alternating layers of the first material and the second material, selectively removing the first material relative to the second material through the opening to provide a plurality of recessed portions along the sidewall of the opening, forming a non-linear element material over the sidewall of the opening and within the recessed portion, forming an electrically conductive electrode material over the non-linear memory element material and filling the recessed portions along the sidewall of the opening, removing a portion of the electrically conductive electrode material from the opening to provide a plurality of isolated electrodes within the recessed portions, forming a non-volatile memory element material over the sidewall of the opening and adjacent to the plurality of isolated electrodes, and forming an electrically conductive bit line material within the opening and adjacent to the non-volatile memory element material.

BRIEF DESCRIPTION OF THE DRAWINGS

FIG. 2A schematically illustrates the electrical connections within a memory array of a ReRAM memory device.

FIG. 2B is an enlarged partial cross-section view of a memory cell of the device of FIG. 2A.

FIG. 2C schematically illustrates a ReRAM memory device having a non-linear element (NLE) connected in series with each memory cell.

FIG. 2D is an enlarged partial cross-section view of a memory cell and NLE of the device of FIG. 2C.

FIG. 2E is an enlarged partial cross-section view of a prior art ReRAM memory device illustrating a non-linear element (NLE) located between a non-volatile memory element material and a vertical bit line.

FIG. 2F is an enlarged partial cross-section view of a prior art ReRAM memory device illustrating a continuous middle electrode layer (MEL) located between a non-volatile memory element material and a non-linear element (NLE).

FIG. 3A is a cross-section view of a ReRAM memory device illustrating a plurality of discrete, isolated middle electrode layers (MELs) located between a non-volatile memory element material and a non-linear element (NLE) according to an embodiment.

FIG. 3B is an enlarged cross-section view of a portion of the ReRAM memory device of FIG. 3A.

FIG. 3C is a top view of the ReRAM memory device of FIG. 3A.

FIG. 4A is a cross-sectional schematic illustration of a non-volatile memory element material connected via a middle electrode to a non-linear element (NLE) comprising a metal-insulator-metal (MIM) junction.

FIG. 4B is a cross-sectional schematic illustration of a non-volatile memory element material connected via a middle electrode to a non-linear element (NLE) comprising a metal-insulator-semiconductor (MIS) junction.

FIG. 4C is a cross-sectional schematic illustration of a non-volatile memory element material connected via a middle electrode to a non-linear element (NLE) comprising a metal-semiconductor (MS) Schottky junction.

FIG. 4D is a cross-sectional schematic illustration of a non-volatile memory element material connected via a middle electrode to a non-linear element (NLE) comprising a metal-insulator-metal (MIM) junction located between the non-volatile memory element material and a word line of a memory device.

FIGS. 5A-5K are side (FIGS. 5A-5D and 5F-5I) and top (FIGS. 5E, 5J and 5K) cross-section views showing process steps for fabricating a ReRAM memory device according to an embodiment.

FIGS. 6A-6E are side (FIGS. 6A-6D) and top (FIG. 6E) cross-section views showing additional process steps for fabricating a ReRAM memory device according to an embodiment.

FIGS. 7A-7K are side (FIGS. 7A-7D and 7F-7I) and top (FIGS. 7E, 7J and 7K) cross-section views showing additional process steps for fabricating a ReRAM memory device according to an embodiment.

FIGS. 8A and 8B are side cross-section views showing additional process steps for fabricating a ReRAM memory device according to an embodiment.

FIG. 9A is a side cross-section view of a ReRAM memory device fabricated in accordance with the process steps of FIGS. 5A-8B.

FIGS. 9B-9D are top cross-section views of the ReRAM memory device of FIG. 9A.

DETAILED DESCRIPTION

Embodiments of the present invention will be described below with reference to the accompanying drawings. It should be understood that the following description is intended to describe exemplary embodiments of the invention, and not to limit the invention.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Embodiments of the invention provide a monolithic, three dimensional array of memory devices, such as an array of ReRAM devices. The memory cells of such devices may be vertically oriented, such that at least one memory cell is located over another memory cell. The array allows vertical scaling of the devices to provide a higher density of memory cells per unit area of silicon or other semiconductor material.

Figure 1:
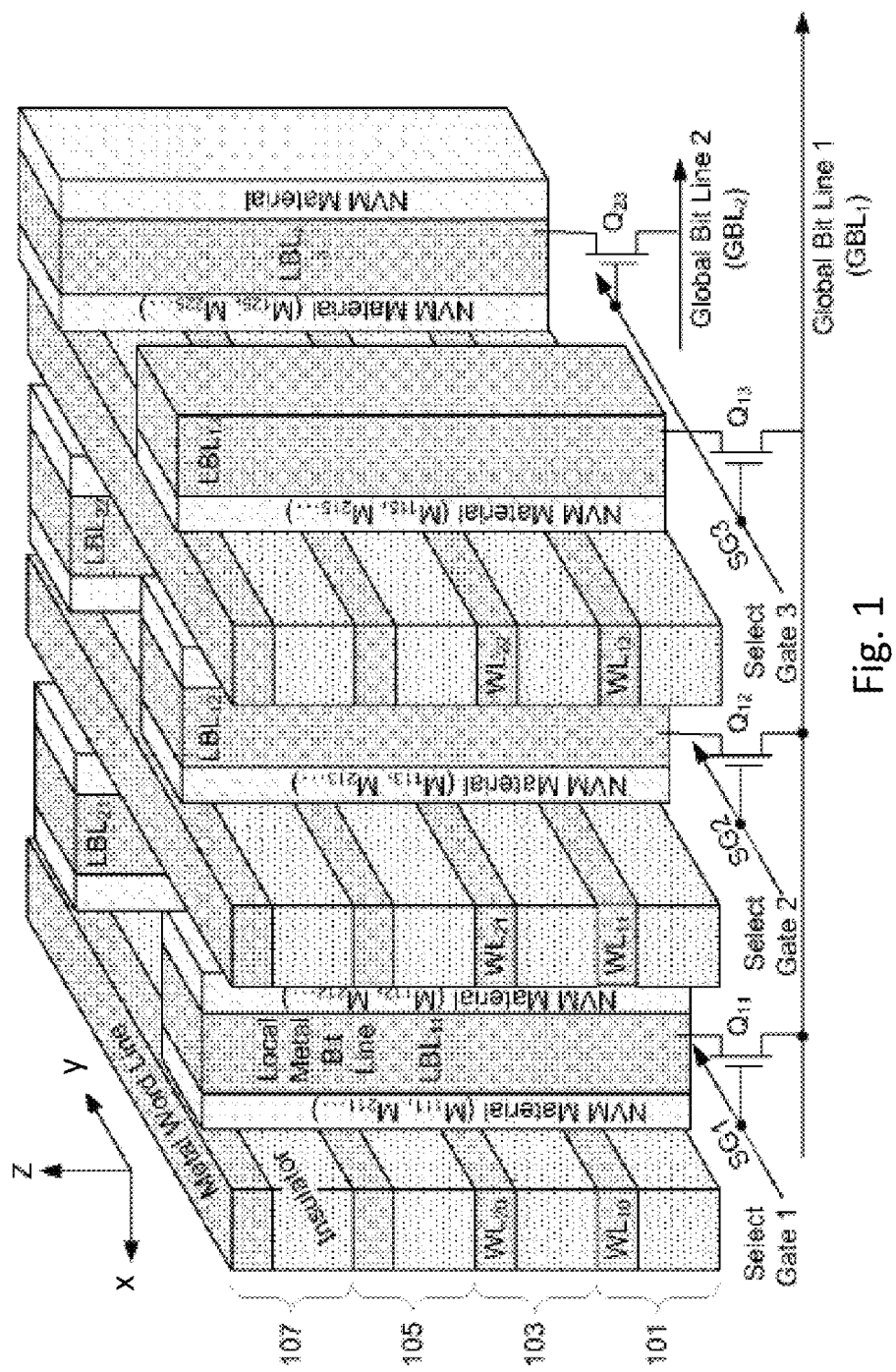
FIG. 1 shows a perspective view of a three dimensional ReRAM memory device.

FIG. 1 shows one example semiconductor structure for implementing a vertically oriented 3D ReRAM memory element, of the type described in U.S. Pat. Pub. No. 2012/0147648, published Jun. 14, 2012 and incorporated by reference herein in its entirety. The ReRAM device is configured for use of non-volatile memory element ("NVM") material that is non-conductive when first deposited. Since the material is initially non-conductive, there is no necessity to isolate the memory elements at the crosspoints of the word and bit lines from each other. Several memory elements may be implemented by a single continuous layer of material, which in the case of FIG. 1 are strips of NVM material oriented vertically along opposite sides of the vertical bit lines in the x-direction and extending upwards through all the planes in the z-direction. A significant advantage of the structure of FIG. 1 is that all word lines and strips of insulation under them in a group of planes may be defined simultaneously by use of a single mask, thus greatly simplifying the manufacturing process.

Referring to FIG. 1, a small part of four planes (e.g., device levels separated in the z-direction) 101, 103, 105 and 107 of the three-dimensional array are shown. All of the planes have the same horizontal pattern of conductive, insulating and NVM materials. In each plane, electrically conductive (e.g., metal) word lines ($WL_{zx}$) are elongated in the y-direction and spaced apart in the x-direction. Each plane includes a layer of insulating material (e.g., a dielectric) that isolates its word lines from the word lines of the plane below it or, in the case of plane 101, of the substrate circuit components below it. In some embodiments, the word lines $WL_{zx}$ for a fixed value of x form a stack of alternating layers that may extend beyond the memory device into a contact area (not shown).

Extending through each plane is a collection of electrically conductive (e.g., metal) local bit line (LBL) "pillars" elongated in the vertical z-direction and forming a regular array in the x-y planes.

Each bit line pillar is connected to one of a set of underlying global bit lines (GBL) (e.g., located in the silicon substrate) running in the x-direction at the same pitch as the pillar spacing through the select devices ($Q_{yx}$) formed in the substrate whose gates are driven by the row select lines (SG) elongated in the y-direction, which are also formed in the substrate. The select devices $Q_{yx}$ may be vertically oriented field effect transistors. Examples of suitable transistors for the select devices $Q_{yx}$ are described, for example, in U.S. patent application Ser. No. 14/206,196, filed Mar. 12, 2014, which is incorporated by reference herein in its entirety. Also fabricated in the substrate but not shown in FIG. 1 are sense amplifiers, input-output (I/O) circuitry, control circuitry, and any other necessary peripheral circuitry. There is one row select line (SG) for each row of local bit line pillars in the y-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the y-direction. A memory storage element (M) is located at each intersection of a word line (WL) and a local bit line (LBL). In the case of a metal oxide (e.g., nickel oxide or copper oxide) for the memory storage element material, a small region of the NVM material between an intersecting local bit line (LBL) and word line (WL) is controllably alternated between more conductive (set) and less conductive (reset) states by appropriate voltages applied to the intersecting lines.

The material used for the non-volatile memory elements $M_{zyx}$ in the array of FIG. 1 can be a metal oxide, a carbon material, a chalcogenide, or any one of a number of materials that exhibit a stable, reversible shift in resistance in response to an external voltage applied to or current passed through the material.

Metal oxides are characterized by being insulating when initially deposited. One suitable metal oxide is a titanium oxide ($TiO_x$) in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements $M_{zxy}$ in the array of FIG. 1 include $HfO_x$, $ZrO_x$, $WO_x$, $NiO_x$ $CoO_x$, $CoAlO_x$, $MnO_x$, $ZnMn_2O_4$, $ZnO_x$, $TaO_x$, $NbO_x$, $HfSiO_x$, $HfAlO_x$. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich $TiO_x$, TiAlN, TaAlN, TiSiN, TaSiN, $IrO_2$ and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g., bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB_2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS_2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the sp² form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in many of the foregoing examples utilize electrodes on either side thereof whose compositions are specifically selected. In embodiments of the three-dimensional memory array herein where the word lines (WL), local bit lines (LBL) and/or middle electrode layers (MELs) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338, which is incorporated by reference in its entirety. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits), which are both incorporated by reference in their entireties.

FIG. 2A schematically illustrates the electrical connections within a three-dimensional memory array of a ReRAM memory device 200. The device 200 shown in FIG. 2A is similar to the ReRAM device of FIG. 1, except in FIG. 2A, the global bit lines (GBL) and select gates (SG) are depicted at the top of the device 200. The device 200 includes a plurality of vertical bit lines (VBLs) (e.g., the LBLs of FIG. 1) and a plurality of word lines (WLs) extending substantially perpendicular to the bit lines. FIG. 2A schematically illustrates a plurality of memory cells 201 located between the bit lines and the word lines. Each memory cell 201 may include a non-volatile memory element material 203 (e.g., the NVM material of FIG. 1, which is also known as a read/write (RW) material) located between an electrically conductive word line material 205 and an electrically conductive bit line material 207, as shown in the enlarged partial cross-section of FIG. 2B (which is rotated 90° relative to the orientation of FIG. 2A).

In a ReRAM device such as shown in FIGS. 2A-2B, the non-linearity of the I-V curve of each memory cell 201 should be high enough to maintain a good cell selectivity in the case of a large cross-point memory array (i.e., having a large number of memory cells located at the intersections bit lines and word lines). The non-linearity factor distribution of the memory cells is typically quite large. This can lower the worst case of the design specification. One method of improving cell selectivity is by providing a non-linear element (NLE) connected in series with the memory cell 201. This is illustrated in FIGS. 2C and 2D, which show a non-linear element (NLE) 209 located between each memory cell 201 and the vertical bit line (VBL) 207. However, this method presents some challenges in the case of a ReRAM device with a vertical bit line architecture.

For example, as shown in FIG. 2E, the IR drop over the NLE 209 may be relatively high because current flows in a very small area. In the case of a non-volatile memory element material 203 in which the resistance change mechanism may be explained by a filament model, the effective electrode area of the NLE 209 is determined by the filament diameter. The IR drop on the NLE 209 is large because the local current density in the NLE 209 is very large.

One way in which this problem may be addressed is to provide a layer of electrically conductive material (i.e., a middle electrode layer (MEL) 211) between the non-volatile memory element material 203 and the NLE 209, as shown in FIG. 2F. However, in this case, the selectivity of the selected cell 201 is low because the middle electrode 211 is shared between multiple cells 201 on the same vertical bit line 207.

Various embodiments relate to monolithic, three-dimensional memory devices, such as ReRAM devices, and methods of making such devices, that include a plurality of discrete middle electrodes which are isolated from one another. In embodiments, a non-volatile memory element material may be located between a bit line extending in a first (e.g., vertical) direction and a plurality of word lines extending in a second (e.g., horizontal) direction perpendicular to the first direction, and the plurality of middle electrodes may be located between the bit line and the plurality of word lines, wherein the plurality of middle electrodes are discrete electrodes which are isolated from one another in at least the second (e.g., vertical) direction. In various embodiments, the middle electrodes may be adjacent to the non-volatile memory element material, and may electrically couple the non-volatile memory element material in series with a non-linear element located between the bit line and the plurality of word lines.

The discrete, isolated middle electrodes of the various embodiments may allow an independent electrode selection from the vertical bit line material. An IR drop across a non-linear element (NLE) located between the middle electrodes and the bit line may be smaller than in a conventional structure (e.g., such as shown in FIG. 2E) because the current density in the NLE may be relatively smaller. This may provide a reduction in the practical operation voltage of the device. In addition, the isolated middle electrodes may dramatically improve memory cell selectivity relative to prior configurations (e.g., such as shown in FIG. 2F).

An embodiment of a ReRAM memory device 300 according to one embodiment is shown in FIGS. 3A-3C. FIG. 3A is a side cross-section view of the ReRAM memory device 300. The device 300 may include a substrate 310 (e.g., a semiconductor substrate, such as a silicon substrate) having a major surface 312 and a plurality of electrically conductive word lines 305 located over the major surface 312 of the substrate 310. FIG. 3C is a top cross-section view of the device 300 taken through line A-A' in FIG. 3A. As shown in FIG. 3C, each word line 305 may be elongated in a first direction (i.e., the y-axis direction in FIG. 3C) that is substantially parallel to the major surface 312 of the substrate 310. As shown in FIG. 3A, the plurality of word lines 305 may be spaced apart from one another in a second direction (i.e., the z-axis direction in FIG. 3A) that is substantially perpendicular to the major surface 312 of the substrate 310. An electrically insulating material 306 (e.g., an oxide or nitride material, such as silicon oxide or silicon nitride) may be located between each of the spaced apart word lines 305, as shown in FIG. 3A.

The device 300 further includes a plurality of electrically conductive bit lines 307 extending in a direction substantially perpendicular to the major surface 312 of the substrate 310 (i.e., in the z-axis direction in FIG. 3A) and adjacent to the plurality of word lines 305. Each bit line 307 may comprise a generally pillar-shaped structure comprising a first side surface 321 which faces a first plurality of vertically-stacked word lines 305, and a second side surface 323, opposite the first side surface 321, which faces a second plurality of vertically-stacked word lines 305.

A non-volatile memory element material 303 may be located between each of the bit lines 307 and the adjacent word lines 305. As shown in FIG. 3A, the non-volatile memory element material 303 may comprise a continuous layer that extends over the first side surface 321 of the bit line 307 and adjacent to the first plurality of vertically-stacked word lines 305. A second continuous layer of the non-volatile memory element material 303 may extend over the second side surface 323 of the bit line 307 and adjacent to the second plurality of vertically-stacked word lines 305.

Individual memory cells 301 (see FIGS. 3B and 3C) may be located at the intersections of the bit lines 307 and the word lines 305, and the non-volatile memory element material 303 may comprise a material in which discrete regions of the material located at the intersections of the bit lines 307 and the word lines 305 may be controllably alternated between a more conductive state and a less conductive state by appropriate voltages applied to the bit line 307 and the respective word line 305. Suitable materials for the non-volatile memory element material 303 include any of the materials described above. In various embodiments, the non-volatile memory element material 303 may comprise a metal oxide material.

As shown in FIG. 3A, the memory device 300 may include a device level 316 containing the bit lines 307, the word lines 305 and the non-volatile memory element material 303, and a lower level 314 below the device level 316 which may comprise a plurality of select transistors 315. Each select transistor 315 may be connected on a first end to a bit line 307, which may be a local bit line, and on a second end to a global bit line 317 that may be elongated in the x-axis direction.

The device 300 may further include a plurality of middle electrodes 311 comprising an electrically conductive material located between the bit line 307 and each of the plurality of word lines 305. The middle electrodes 311 comprise discrete electrodes which are isolated from one another (i.e., they are physically separated from each other, as shown by arrows 325 in FIG. 3B) along the length of the bit line 307 (i.e., in the z-axis direction in FIGS. 3A and 3B). Each of the middle electrodes 311 may be adjacent to the non-volatile memory element material 303, and may electrically connect the non-volatile memory element in series with a non-linear element 309. In the embodiment of FIGS. 3A-3C, the non-linear element 309 is located between the middle electrodes 311 and the bit line 307 and the non-volatile memory element material 303 located between the word lines 305 and the middle electrodes 311. Alternatively, as described further below, the non-linear element 309 may be located between the middle electrodes 311 and the word line 305 (i.e., the locations of the non-volatile memory element material 303 and the non-linear element 309 may be switched relative to the configuration of FIGS. 3A-3C).

The non-linear element 309 may comprise any structure that provides a desired nonlinearity in the current-voltage characteristic over the structure. Exemplary non-linear elements 309 may comprise a metal-insulator-metal (MIM) junction, a metal-insulator-semiconductor (MIS) junction, or a metal-semiconductor (MS) Schottky junction. In embodiments, the middle electrode layer 311 and/or one of the bit line 307 or word line 305 may serve as an electrode (i.e., metal or semiconductor) of the non-linear element 309. In other embodiments, the electrodes (i.e., metal or semiconductor) of the non-linear element 309 may be separate from the middle electrode 311, bit line 307 and word line 305. The electrical transport mode for providing the non-linear properties of the non-linear element 309 may include, for example, Poole-Frenkel (PF) emission, Schottky transport, or a tunneling mode, such as direct, Fowler-Nordheim (FN) and/or trap-assist tunneling.

FIGS. 4A-4D illustrate examples of a non-linear element 309 in a memory cell 301 (shown rotated 90° relative to the orientation of FIG. 3B) according to various embodiments. In FIG. 4A, the non-linear element 309 comprises a metal-insulator-metal (MIM) junction. The bit line 307 comprises a metal material that forms a first electrode of the MIM junction. A layer 401 of insulating material is located over the surface of the bit line 307 and forms the insulator of the MIM junction. (The layer 401 of insulating material is shown beneath the bit line 307 in the 90° rotated view of FIG. 4A). The middle electrode layer 311 comprises a metal material that forms the second electrode of the MIM junction. Also shown in FIG. 4A is the non-volatile memory element material 303 adjacent to the middle electrode layer 311 which connects the non-volatile memory element material 303 in series with the non-linear element 309. The word line 305 is located adjacent to the non-volatile memory element material 303, opposite the middle electrode layer 311.

FIG. 4B illustrates a non-linear element 309 which comprises a metal-insulator-semiconductor (MIS) junction. The bit line 307 comprises an electrically conductive material, which may be a metal or heavily doped semiconductor material, for example. A layer 403 of a semiconductor material is located over the electrically conductive bit line 307 and forms the semiconductor electrode of the MIS junction. A layer 405 of an insulating material is located over the layer 403 of semiconductor material, and forms the insulator of the MIS junction. (The respective semiconductor and insulating material layers 403, 405 are shown beneath the bit line 307 in the 90° rotated view of FIG. 4B). The middle electrode layer 311 comprises a metal material that forms the metal electrode of the MIS junction. The non-volatile memory element material 303 is located adjacent to the middle electrode layer 311 which connects the non-volatile memory element material 303 in series with the non-linear element 309. The word line 305 is located adjacent to the non-volatile memory element material 303, opposite the middle electrode layer 311.

FIG. 4C illustrates a non-linear element 309 which comprises a metal-semiconductor (MS) Schottky junction. The bit line 307 comprises an electrically conductive material, which may be a metal or heavily doped semiconductor material, for example. A layer 407 of a semiconductor material is located over the electrically conductive bit line 307 and forms the semiconductor electrode of the MS Schottky junction. (The semiconductor layer 407 is shown beneath the bit line 307 in the 90° rotated view of FIG. 4C). The middle electrode layer 311 comprises a metal material that forms the metal electrode of the MS Schottky junction. The non-volatile memory element material 303 is located adjacent to the middle electrode layer 311 which connects the non-volatile memory element material 303 in series with the non-linear element 309. The word line 305 is located adjacent to the non-volatile memory element material 303, opposite the middle electrode layer 311.

In each of FIGS. 4A-4C, the non-linear element 309 is located between the non-volatile memory element material 303 and the bit line 307 in the memory cell 301 (e.g., between the middle electrode layer 311 and the bit line 307). FIG. 4D illustrates an alternative embodiment in which the non-linear element 309 is located between the non-volatile memory element material 303 and the word line 305 in the memory cell 301 (e.g., between the middle electrode layer 311 and the word line 305). FIG. 4C illustrates a metal-insulator-metal (MIM) junction non-linear element 309 between the non-volatile memory element material 303 and the word line 305, although it will be understood that a MIS junction or MS Schottky junction such as described above could also be located between the non-volatile memory element material 303 and the word line 305. As shown in FIG. 4D, word line 305 comprises a metal material that forms a first electrode of the MIM junction. A layer 409 of insulating material is located over the surface of the word line 305 and forms the insulator of the MIM junction. The middle electrode layer 311 comprises a metal material that forms the second electrode of the MIM junction. The non-volatile memory element material 303 is adjacent to the middle electrode layer 311 which connects the non-volatile memory element material 303 in series with the non-linear element 309. The bit line 307 is located adjacent to the non-volatile memory element material 303, opposite the middle electrode layer 311.

In the various embodiments of the non-linear element 309 shown in FIGS. 4A-4D, the metal or semiconductor electrode layers of the MIM, MIS or MS junctions may comprise one or more of Al, Ni, Co, Hf, Zr, Ta, Ti, V, W, Cr, Ir, Pt, Si (doped or undoped) and Ge (doped or undoped). In embodiments, nitrides, silicides, alloys, laminates and graded layers comprising one or more of the above-listed materials may also be utilized.

The insulator layers 401, 405, 409 may comprise any suitable insulating material, such as a stoichiometric or non-stoichiometric oxide or nitride material, including SiO, SiN, AlO, AlN, TaO, HfO, ZrO, TiO, NiO, WO, CoO, VO, NbO, CuO, ZnO, MoO, IrO, MgO, etc (e.g., SiO may be stoichiometric $SiO_2$ or non-stoichiometric $SiO_x$ where x does not equal to 2, etc.).

Referring again to FIGS. 3A-3C, in this embodiment, the non-linear element 309 comprises a metal-insulator-metal (MIM) junction that includes a layer 401 of insulating material over the surfaces 321, 323 of the bit line 307 and located between the bit line 307 and each of the plurality of middle electrodes 311. As shown in the top view of FIG. 3C, the generally pillar-shaped bit line 307 may have a substantially rectangular cross-section, and the insulating layer 401 of the non-linear element 309 may be located adjacent to all four side surfaces (i.e., sidewalls) of the bit line 307, while the plurality of middle electrodes 311 are adjacent to two opposing side surfaces 321, 323 of the bit line 307. In this embodiment, both the bit line 307 and the middle electrodes 311 may comprise a metal material adjacent to the insulating material layer 401 and forming the respective metal electrodes of the MIM junction non-linear element 309.

As illustrated in the enlarged side-cross section view of FIG. 3B, the layer of non-volatile memory element material 303 may comprise a plurality of clam shape portions 327 adjacent to each of the plurality of word lines 305. As used herein a "clam" shape is a side cross sectional shape configured similar to an English letter "C". A clam shape has two segments 329, 331 which extend substantially parallel to each other and to the major surface 312 of the substrate 310. The two segments 329, 331 are connected to each other by a third segment 333 which extends substantially perpendicular to the first two segments and the surface 312. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments 329, 331, 333 and having a fourth side open. As shown in FIG. 3B, the segments 329, 331 and 333 of the clam shaped portions 327 of the non-volatile memory element material 303 may surround the respective middle electrode 311 on three sides of the middle electrode 311.

FIGS. 5A-8B illustrate an embodiment method for fabricating a ReRAM memory device, such as the device 300 shown in FIGS. 3A-3C, according to an embodiment. FIGS. 5A-5K illustrate a first portion of the fabrication process that includes forming a word line stack over a substrate, forming openings through the word line stack, and forming a non-volatile memory element material over the sidewalls of the openings. As shown in FIGS. 5A and 5B, a stack 501 of alternating layers of a first material 503 and a second material 505 different from the first material 503 are provided over the major surface 312 of a substrate 310. FIG. 5A is a side-cross section view in a first plane of the stack 501 (i.e., along the x- and z-axes) and FIG. 5B is a side-cross section view in a second plane perpendicular to the first plane (i.e., along the y- and z-axes) taken along the dashed-dotted line in FIG. 5A.

FIGS. 5A-5B show the stack 501 located directly over the substrate 310 for clarity. In embodiments, there may be one or more additional layers between the substrate 310 and the stack 501, such as the lower level 314 containing the select transistors 315, as shown in FIG. 3A.

The first material layers 503 of the stack 501 may comprise an electrically conductive word line material, and may comprise, for example, a metal or metal alloy, a metal silicide, a metal nitride or a heavily doped semiconductor material. The second material layers 505 of the stack 501 may comprise an insulating material, such as an oxide or nitride material (e.g., silicon oxide or silicon nitride).

FIG. 5A shows a patterned mask 507 over the top surface of the stack 501. The patterned mask 507 may comprise a hard mask and/or photoresist, which may be formed using photolithography and etching that exposes only portions of the underlying structure intended for removal. In one embodiment, the mask 507 may comprise a silicon nitride hard mask. An etching process may then be used to etch through the patterned mask 507 to remove exposed portions of the stack 501 to form a plurality of openings 509 through the stack 501, as shown in FIGS. 5C and 5D. The openings 509 may comprise trenches elongated in the direction of the y-axis and may include a pair of sidewalls 511, 513 defined by the alternating layers of the first material 503 and the second material 505 of the stack 501. FIG. 5C is a side cross-section view in the x-z plane of the stack 501 showing the plurality of trench openings 509. FIG. 5D is a side-cross section view in the y-z plane of the stack 501 taken along the dashed-dotted line in FIG. 5C (i.e., through one of the openings 509). FIG. 5E is a top cross-section view taken along line A-A' of FIG. 5C, and shows that the un-etched portions of the stack 501 between each trench opening 509 and covered by the mask 507 form a plurality of parallel strips elongated in the y-axis direction and spaced apart in the x-axis direction.

In FIGS. 5F, 5G and 5J, the stack 501 may be etched through the trench openings 509 to selectively remove the first material 503 relative to the second material 505 to provide a plurality of recessed portions 515 along the sidewalls 511, 513 of the trench openings 509. The etching may be a wet chemical etching process using an etchant that has a higher etch rate for the first material 503 than for the second material 505. FIG. 5F is a side cross-section view in the x-z plane of the stack 501 showing the recessed portions 515. FIG. 5G is a side-cross section view in the y-z plane of the stack 501 taken along the dashed-dotted line in FIG. 5F. FIG. 5J is a top cross-section view taken along line B-B' of FIG. 5F, and shows that the first material 503 of the stack 501 is recessed compared to FIG. 5E.

In FIGS. 5H, 5I and 5K, a non-volatile memory element material 303 may be formed within the trench openings 509, including over the bottom surfaces 517 of the openings and along the sidewalls 511, 513 of the openings 509, including within the recessed portions 515 along the sidewalls 511, 513 of the trench openings 509. The non-volatile memory element material 303 may comprise any of the materials described above in which discrete regions of the material may be controllably alternated between a more conductive state and a less conductive state by the application of a suitable voltage to the region. In one embodiment, the non-volatile memory element material 303 may be a metal oxide material and may be formed by atomic layer deposition (ALD).

FIG. 5H is a side cross-section view in the x-z plane of the stack 501 showing the non-volatile memory element material 303 located over the sidewalls 511, 513 of the trench openings 509. As shown in FIG. 5H, the layer of the non-volatile memory element material 303 may form a "clam" shape such as described above within the recessed portions 515. FIG. 5I is a side-cross section view in the y-z plane of the stack 501 taken along the dashed-dotted line in FIG. 5H, and shows the non-volatile memory element material 303 over the bottom surface 517 of a trench opening 509. FIG. 5K is a top cross-section view taken along line C-C' of FIG. 5H, and shows the non-volatile memory element material 303 over recessed portions 515 in the sidewalls 511, 513 of the stack 501.

FIGS. 6A-6E illustrate additional steps of the memory device fabrication method, including the formation of a plurality of generally pillar-shaped bit line openings within each of the trench openings 509 of the stack 501. In FIGS. 6A, 6B and 6E, the trench openings 509 may be filled with an insulating material 601, such as an oxide material (e.g., silicon oxide), followed by planarization of the insulating material 601, e.g. by etching or chemical mechanical polishing. The insulating material 601 may be formed in the trench openings 509 by chemical vapor deposition (CVD), for example. The insulating material 601 may be made planar with the top surface of the patterned mask 507, as shown in FIG. 6A. FIG. 6A is a side cross-section view in the x-z plane of the stack 501 showing the insulating material 601 within the trench openings 509. FIG. 6B is a side-cross section view in the y-z plane of the stack 501 taken along the dashed-dotted line in FIG. 6A showing the insulating material 601 within a trench opening 509. FIG. 6E is a top cross-section view taken along line D-D' of FIG. 6A.

A second patterned mask 603 may be formed over the top surface of the stack 501, including over the top surfaces of the first mask 507 and the insulating material 601. The second patterned mask 603 may comprise a hard mask and/or photoresist, which may be formed using photolithography and etching that exposes only portions of the underlying structure intended for removal. The second patterned mask 603 may comprise a plurality of elongated strips 605 that extend in the x-axis direction and are spaced apart in the y-axis direction of FIGS. 6C and 6D. In other words, the strips 605 of the second patterned mask 603 may be substantially perpendicular to the direction in which the trench openings 509 extend.

FIG. 6C is a side cross-section view in the x-z plane of the stack 501 and FIG. 6D is a side-cross section view in the y-z plane of the stack 501. FIG. 6C is taken through the dashed-double-dotted line of FIG. 6D, and FIG. 6D is taken through the dashed-dotted line of FIG. 6C. FIG. 6D illustrates the second patterned mask 603 over the top surface of the stack 501, and shows the elongated strips 605 of the mask 603 that extend in the x-axis direction (i.e., into and out of the page in FIG. 6D and left-to-right in FIG. 6C) and are spaced apart by open regions 607 in the y-axis direction (i.e., left-to-right in FIG. 6D and into and out the page in FIG. 6C). The cross-section view of FIG. 6C is taken through an open region 607 of the second mask 603, and thus the second mask 603 is not visible in FIG. 6C.

An etching process may then be used to etch through the second patterned mask 603 to remove exposed portions of the insulating material 601 to form a plurality of generally rectangular-shaped bit line openings 609 (see FIGS. 7A-7E) through the insulating material 601. The first patterned mask 507 may protect portions of the stack 501 between the trenches 509 from being etched. The bit line openings 609 may have first and second opposite sidewalls 611, 613 (see FIGS. 7A, 7B and 7E) that extend parallel to the sidewalls 511, 513 of the trench opening 509 (see FIG. 5F), and third and fourth opposite sidewalls 615, 617 (see FIGS. 7B, 7D and 7E) that extend substantially perpendicular to the first and second sidewalls 611, 613.

The third and fourth sidewalls 615, 617 of the bit line openings 609 may be defined by the insulating material 601. In embodiments, the first and second sidewalls 611, 613 may be defined, at least in part, by the layer of non-volatile memory element material 303 extending over the sidewalls 511, 513 of the trench openings 609. At least some insulating material 601 may remain on the first and second sidewalls 611, 613 of the bit line openings 609, such as within the recessed portions 515.

An optional second etching process may be performed to remove additional insulating material 601 and expose the layer of non-volatile memory element material 303 on the first and second sidewalls 611, 613 of the bit line openings 609. For example, the first etching process to form the bit line openings 609 in the insulating material 601 may be an anisotropic etching process, such as a reactive-ion etching (RIE) process, and the second etching process may be a wet chemical etching process to remove additional insulating material 601, including from the recessed portions 515. In an embodiment, the insulating material 601 is completely removed from the sidewalls 511, 513, including from the recessed portions 515, and the first and second sidewalls 611, 613 of the bit line openings 609 are defined by the non-volatile memory element material 303 located over the sidewalls 511, 513 of the trench openings 609. The second etching process may enlarge the size of the bit line openings 609 in the y-axis direction.

Figures 7A, 7B, 7C, 7D, 7E:
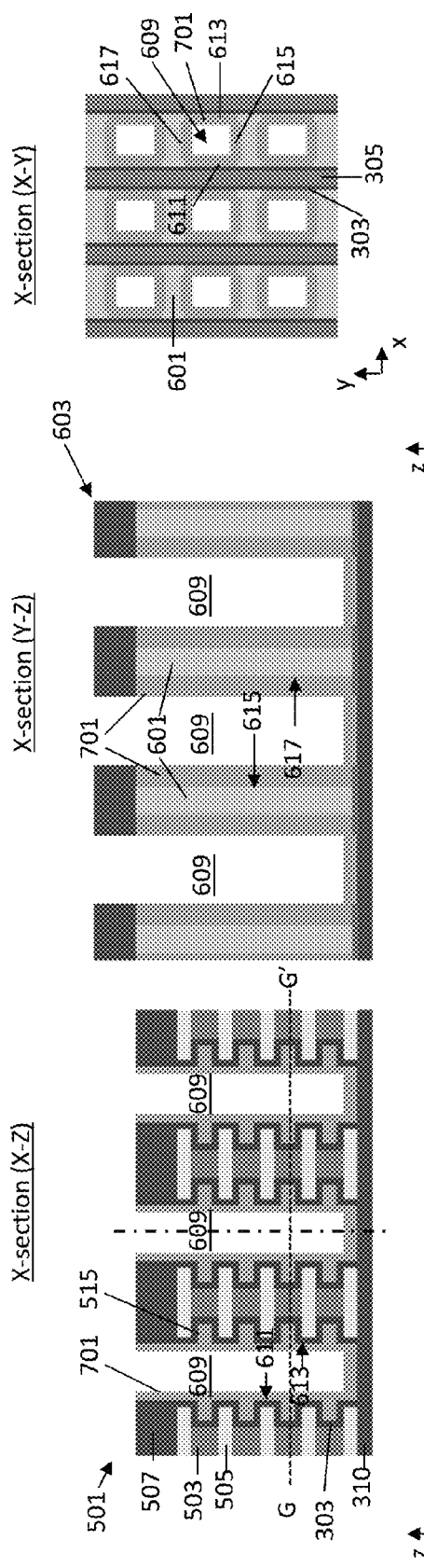

FIGS. 7A-7K illustrate additional process steps of the memory device fabrication method according to one embodiment, including the formation of a plurality of isolated middle electrodes 311. In FIGS. 7A, 7B and 7E, an electrically conductive material 701 is formed over the sidewalls 611, 613, 615, 617 of the bit line openings 609. The electrically conductive material 701 may be formed over the non-volatile memory element material 303 on the first and second sidewalls 611, 613 of the bit line openings 609, and may completely fill the recessed portions 515, as shown in the side (x-z plane) cross-section view of FIG. 7A. FIG. 7B is a side cross-section view in the y-z plane, taken along the dotted dashed line of FIG. 7A, and shows the electrically conductive material 701 over the third and fourth sidewalls 615, 617 of the bit line openings 609. FIG. 7E is a top cross-section view taken along line G-G' in FIG. 7A, and shows the electrically conductive material 701 over all of the sidewalls of the bit line openings 609 and at least partially filling the bit line openings 609.

In embodiments, the electrically conductive material 701 may comprise any suitable conductive material, such as a metal or metal alloy, a metal nitride, a metal silicide, a heavily doped semiconductor, or combinations of any of these materials. The electrically conductive material 701 may be deposited by CVD and may be planarized (e.g., via etch-back or CMP) to remove the material 701 from outside of the bit line openings 609.

In FIGS. 7C and 7D, portions of the second patterned mask 603 located above the electrically conductive material 701 may be removed to expose the electrically conductive material 701 over the third and fourth sidewalls 615, 617 of the bit line openings 609. In embodiments, the elongated strips 605 of the mask 603 that extend in the x-axis direction (i.e., into and out of the page in FIG. 7D) may be "slimmed" relative to the elongated strips 605 of the mask 603 shown in FIG. 6D. The second patterned mask 603 may comprise a silicon nitride hard mask, for example, and may be slimmed using an etching process that selectively etches the silicon nitride hard mask 603 while leaving underlying layers substantially intact.

In FIGS. 7F, 7G and 7J, portions of the electrically conductive material 701 may be removed from the bit line openings 609 to provide a plurality of isolated middle electrodes 311 within the recessed portions 515. The electrically conductive material 701 may be removed by etching the material 701 through the first patterned mask 507 and the second patterned mask 603 to remove the material 701 from the sidewalls 611, 613, 615, 617 of the bit line openings 609. The etching may be stopped at the non-volatile memory element material 303 on the first and second sidewalls 611, 613 of the bit line openings 609 and on the insulating material 601 on the third and fourth sidewalls 615, 617 of the bit line openings 609 while leaving isolated portions of the conductive material 701 within the recessed portions 515 along the opposing first and second sidewalls 611, 613 of the bit line openings 609. This is shown in FIG. 7F, which is a side cross-section view in the x-z plane showing the isolated middle electrodes 311 formed of the electrically conductive material 701 within the recessed portions 513 over the first and second sidewalls 611, 613 of the bit line openings 609. FIG. 7G is a side cross-section view in the y-z plane taken along the dotted dashed line of FIG. 7F that shows the electrically conductive material 701 removed from the third and fourth sidewalls 615, 617 of the bit line openings 609. FIG. 7J is a top cross-section view taken along line H-H' of FIG. 7F.

A non-linear element, such as a metal-insulator-metal (MIM) junction, a metal-insulator-semiconductor (MIS) junction, a tunnel junction and/or a Schottky junction, may then be formed in the bit line openings 609. As shown in FIGS. 7H, 7I and 7K, at least one non-linear element material layer 703 may be formed over the sidewalls 611, 613, 615, 617 of the bit line openings 609. The layer 703 may comprise an insulating material, such as an oxide or nitride material, and may be deposited by atomic layer deposition (ALD). In embodiments, the layer 703 may comprise an insulating material that serves as the insulating layer of a metal-insulator-metal (MIM) non-linear element, such as described above with reference to FIG. 4A. The isolated middle electrodes 311 may provide the first (i.e., metal) electrodes of the MIM non-linear element, and the second metal electrodes of the MIM non-linear element may be provided by metal material bit lines formed in the bit line openings 609, as described further below.

In embodiments where the non-linear element is a metal-insulator-semiconductor (MIS) structure, such as shown in FIG. 4B, the layer 703 may comprise an insulating material, and a semiconductor material (not shown in FIGS. 7H, 7I and 7K) may be formed over the insulating material. The isolated middle electrodes 311 may provide the first (i.e., metal) electrodes of the MIS non-linear element.

In embodiments where the non-linear element is a metal-semiconductor (MS) Schottky structure, such as shown in FIG. 4C, the layer 703 may comprise a semiconductor material. The isolated middle electrodes 311 may provide the first (i.e., metal) electrodes of the MS non-linear element.

FIG. 7H is a side cross-section view in the x-z plane which shows the non-linear element layer 703, which in this embodiment comprises an insulating material layer, formed over the first and second sidewalls 611, 613 of the bit line openings 609 and adjacent to the isolated middle electrodes 311. FIG. 7I is a side cross-section view in the y-z plane, taken along the dotted dashed line of FIG. 7H, which shows the non-linear element layer 703 over the third and fourth sidewalls 615, 617 of the bit line openings 609. FIG. 7J is a top cross-section view taken along line I-I' of FIG. 7H, which shows the non-linear element layer 703 extending around the periphery of the bit line openings 609.

An electrically conductive bit line material 801 may be formed within the bit line openings 609 to form a plurality of bit lines 307, as shown in FIGS. 8A-8B. FIG. 8A is a side-cross section view in the x-z plane and FIG. 8B is a side cross-section view in the y-z plane taken alone the dotted dashed line of FIG. 8A. The electrically conductive bit line material 801 may comprise, for example, a metal or metal alloy, a metal silicide, a metal nitride or a heavily doped semiconductor material. The electrically conductive bit line material 801 may completely fill the bit line openings 609, and may be formed by chemical vapor deposition (CVD), for example. In embodiments, the electrically conductive bit line material 801 may comprise a metal material and may serve as the second metal electrode of a metal-insulator-metal (MIM) non-linear element, where the layer 703 may comprise the insulating material layer and the isolated middle electrodes 311 serve as the first metal electrode. The layers of the first material 503 of the stack 501 may comprise the word lines 305 of the memory device, as shown in FIG. 8A.

FIG. 9A is a side cross-section view in the x-z plane of a finished ReRAM memory device 300 fabricated in accordance with the process steps of FIGS. 5A-8B. FIG. 9A illustrates the lower level 314 below the device level 316 which comprises a plurality of select transistors 315. FIG. 9B is a top cross-section view of the ReRAM memory device 300 taken along line J-J' of FIG. 9A, FIG. 9C is a top cross-section view of the ReRAM memory device 300 taken along line K-K' of FIG. 9A, and FIG. 9D is a top cross-section view of the ReRAM memory device 300 taken along line L-L' of FIG. 9A.

In the embodiment of FIGS. 9A-9D, the non-volatile memory element material 303 is located adjacent to the word lines 305, and the non-linear element material layer 703 is located between the non-volatile memory element material 303 and the bit lines 307. Alternatively, the non-volatile memory element material 303 may be located adjacent to the bit lines 307, and the non-linear element material 703 may be located between the non-volatile memory element material 303 and the word lines 305. In this alternative embodiment, instead of the non-volatile memory element material 303 being formed over the over the sidewalls 511, 513 of the trench openings 509, as shown in FIG. 5H, the non-linear element material 703 may be formed over the sidewalls 511, 513 of the trench openings 509 and may form, at least in part, a non-linear element between the respective word lines 305 and the middle electrodes 311. In addition, instead of the non-linear element material 703 being formed over the sidewalls 611, 613, 615, 617 of the bit line openings 609, as shown in FIGS. 7I-7K, a non-volatile memory element material 303 may be formed over the sidewalls 611, 613, 615, 617 of the bit line openings 609. Thus, the non-volatile memory element material 303 may be formed adjacent to the bit line 307, and a non-linear element may be located between the non-volatile memory element material 303 and the word lines 305. The isolated middle electrodes 311 may connect the non-volatile memory element 303 in series with the non-linear element.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A monolithic, three-dimensional memory device, comprising:
a substrate having a major surface;
a plurality of electrically conductive word lines over the major surface of the substrate, wherein each word line is elongated in a first direction that is substantially parallel to the major surface of the substrate and the plurality of word lines are spaced apart from one another in a second direction that is substantially perpendicular to the major surface of the substrate, and an electrically insulating material is located between each of the spaced apart word lines;
an electrically conductive bit line extending in a direction substantially perpendicular to the major surface of the substrate and adjacent to each of the plurality of word lines;
a non-volatile memory element material located between the bit line and each of the plurality of word lines; and
a plurality of middle electrodes comprising an electrically conductive material located between the bit line and each of the plurality of word lines, wherein the plurality of middle electrodes are discrete electrodes which are isolated from one another in at least the second direction.

2. The device of claim 1, further comprising:
a non-linear element located between the bit line and each of the plurality of word lines.

3. The device of claim 2, wherein each of the middle electrodes is adjacent to the non-volatile memory element material and electrically connects the non-volatile memory element material in series with the non-linear element.

4. The device of claim 2, wherein the non-linear element comprises a Schottky junction.

5. The device of claim 2, wherein the non-linear element comprises a tunnel junction.

6. The device of claim 2, wherein the non-linear element comprises a metal-insulator-metal (MIM) junction.

7. The device of claim 2, wherein the non-linear element is formed by providing a layer of insulating material over at least one side surface of the bit line.

8. The device of claim 1, wherein the plurality of middle electrodes are located between the non-volatile memory element material and the bit line.

9. The device of claim 1, wherein the plurality of middle electrodes are located between the non-volatile memory element and the word lines.

10. The device of claim 1, wherein the bit line comprises a generally pillar-shaped structure having at least one side surface, and the non-volatile memory element material comprises a continuous layer that extends over a side surface of the bit line and adjacent to each of the plurality of word lines.

11. The device of claim 10, wherein:
the layer of non-volatile memory element material comprises a plurality of clam shape portions adjacent to each of the plurality of word lines;
each of the clam shape portions surrounds a respective one of the plurality of middle electrodes on three sides;
the bit line comprises the generally pillar-shaped structure having a substantially rectangular cross section;
the non-linear element is located adjacent to all four sidewalls of the substantially-pillar shaped bit line; and
the a plurality of middle electrodes are located adjacent to two of four sidewalls of the substantially-pillar shaped bit lines.

12. The device of claim 1, wherein the monolithic, three-dimensional memory device comprises a ReRAM memory device.

13. The device of claim 1, wherein the electrically conductive bit line comprises a local bit line that is electrically connected to a global bit line via a select transistor.

14. The device of claim 1, wherein the non-volatile memory element material comprises a material in which discrete regions of the material located between the bit line and each of the plurality of word lines are controllably alternated between a more conductive state and a less conductive state by appropriate voltages applied to the bit line and the respective word line.

15. The device of claim 14, wherein the non-volatile memory element material comprises a metal oxide.

* * * * *